United States Patent [19]

Akimoto et al.

[11] Patent Number: 5,063,581
[45] Date of Patent: Nov. 5, 1991

[54] SEMICONDUCTOR IMAGING DEVICE HAVING A PLURALITY OF PHOTODIODES AND CHARGE COUPLED DEVICES

[75] Inventors: Hajime Akimoto, Hachioji; Toshifumi Ozaki, Koganei; Kazuya Tokumasu, Kodaira; Hideyuki Ono; Haruhiko Tanaka, both of Kokubunji, all of Japan

[73] Assignee: Hitachi, Ltd., Tokyo, Japan

[21] Appl. No.: 557,699

[22] Filed: Jul. 25, 1990

[30] Foreign Application Priority Data

Jul. 31, 1989 [JP] Japan .............................. 1-196568

[51] Int. Cl.$^5$ .......................................... H01L 27/148
[52] U.S. Cl. .......................................... 377/58; 357/24
[58] Field of Search ................... 357/24 LR, 24 M; 377/58

[56] References Cited

U.S. PATENT DOCUMENTS 3,896,474  7/1975  Amelis et al. ................. 357/24 M
4,851,890  7/1989  Miyatake ...................... 357/24 LR

OTHER PUBLICATIONS

Esser, ISSCC, Feb. 1974, pp. 28–29 and 219.
Ishihara et al., ISSCC, Feb. 1982, pp. 168–169.

Primary Examiner—William D. Larkins
Attorney, Agent, or Firm—Antonelli, Terry, Stout & Kraus

[57] ABSTRACT

The semiconductor device having both vertically arranged CCDs and a horizontal CCD, such as, in connection with a solid state image pickup device, is provided with a horizontal CCD in which the transfer speed and the transfer efficiency of a horizontal CCD thereof is improved substantially. In such a device, a plurality of photodiodes are provided on a semiconductor substrate, vertical CCDs are provided on the semiconductor substrate for transferring signal charges of the photodiodes and a horizontal CCD is provided on the semiconductor substrate for transferring signal charges received from the vertical CCDs. The vertical and horizontal CCDs of such a semiconductor device are formed in a well structure provided on the substrate such that the depletion region extending from the channel of the horizontal CCD and a depletion region produced between the underlying substrate and the well are configured to meet each other under each of the transfer electrodes of the horizontal CCD. The depletion region extending from a channel of the vertical CCDs and the depletion region produced between the underlying substrate and the well, however, do not meet each other under each of the transfer electrodes thereof.

22 Claims, 9 Drawing Sheets (a) p-WELL IS NOT DEPLETED (CONVENTIONAL)
(b) p-WELL IS PARTIALLY DEPLETED } (PRESENT INVENTION)
(c) p-WELL IS COMPLETELY DEPLETED

SEMICONDUCTOR IMAGING DEVICE HAVING A PLURALITY OF PHOTODIODES AND CHARGE COUPLED DEVICES

BACKGROUND OF THE INVENTION

The present invention relates to a semiconductor device such as a CCD (Charge Coupled Device) type solid state image pickup device in which it is required to transfer signal charges in a depletion region (channel) formed under electrodes with high signal charge transfer efficiency.

A method of improvement of charge transfer speed and transfer efficiency of a semiconductor device composed of a plurality of electrodes formed on a surface of a semiconductor region through an insulating film and a structure for applying a predetermined voltage to these plurality of electrodes in consecutive order for transferring signal charges in a depletion region formed under these electrodes, that is, in a charge coupled device (CCD) is discussed in L. J. M. Esser, entitled "The Peristaltic Charge-Coupled Device for High-Speed Charge Transfer", ISSCC Digest of Tech. Papers, February 1974, pp. 28-29. It is stated in this literature that a well known CCD with a buried channel is provided in an epitaxial layer having a thickness of 4.5 microns and having the same conductivity type as a buried impurity layer which is formed on a substrate of a complementary conductivity type to that of the buried impurity layer for the purpose of improving charge transfer speed and transfer efficiency of a CCD.

A structure of providing a CCD in a well of a conductivity type which is complementary to that of a buried impurity layer formed on a substrate of the same conductivity type as that of the buried impurity layer is discussed in Y. Ishihara et al., "Interline CCD Image Sensor with an Anti Blooming Structure", ISSCC Digest of Tech. Papers, February 1982, pp. 168-169.

SUMMARY OF THE INVENTION

In the latter one of the above said published articles, it is stated that an n-channel CCD type solid state image pickup device is formed in a p-well formed on an n-type substrate. However, no consideration is given therein to providing a depletion region of the CCD and a depletion region produced between the n-type substrate and the p-well during transfer of signal charges which meet each other under each of the transfer electrodes thereof. Such a point will be explained hereinbelow with reference to FIG. 13 and FIG. 14.

FIG. 13 is a sectional view of a CCD in a conventional example which is parallel with the direction transfer of signal charges. A CCD consisting of a buried channel 4 and transfer gates 101, 102 and 103 is provided on a p-well 24 formed on an n-type substrate 6. Besides, insulating films formed between transfer gates and between transfer gates and the semiconductor substrate are omitted for purposes of this discussion and from the respective accompanying drawings for the sake of simplicity.

By applying a predetermined voltage to the transfer gates 101, 102 and 103, the buried channel 4 is depleted completely, and the potential of the buried channel 4 is set to a value corresponding to the voltage of the transfer gates 101, 102 and 103 in the upper part. Since signal charges drift by means of the electric field formed by abovesaid potential, it is possible to transfer signal charges along the buried channel 4 by applying a predetermined voltage pulse to the transfer gates 101, 102 and 103.

A potential profile in FIG. 13 is shown using potential contour lines in FIG. 14 for the purpose of explaining the foregoing. In the figure, however, potential contour lines in the vicinity of respective transfer gates are omitted for the sake of simplicity, and the same is applied to respective potential profile diagrams shown hereafter. In FIG. 14, it is assumed that a high voltage is applied to respective transfer gates in the order of 101, 102 and 103. Arrow marks A and C show directions of the electric fields at respective points. As described above, transfer of signal charges is performed by the electric field formed by the potential in the channel 4. Accordingly, in order to improve the transfer speed of signal charges and to lower the transfer inefficiency, it is required to make the electric field (fringing field) at the center of the transfer gate 102 shown with the arrow mark A in FIG. 14 as large as possible. Here, the direction of the electric field in the p-well 24 shown with an arrow mark C under the channel 4 is taken into consideration. Although the electric field is inclined to the left slightly under the influence of the electric field in the channel 4 as shown in the figure, this electric field, in effect, is in an upwardly pointing direction. In other words, the electric field in the p-well 24 is of little consequence insofar as enlarging the electric field shown in the direction of the arrow mark A.

For a very long time, it has been an important aspect of CCD design to search for ways to improve the transfer speed of signal charges and to reduce transfer remainder i.e. enhance transfer efficiency. A solid state image pickup device is well known as an important application of a CCD. However, the number of picture elements of a solid state image pickup device is increasing year by year and, moreover, even the diffusion of the camera with respect to using a solid state image pickup device corresponding to high-vision is expected, wherein improvement of the transfer speed of the CCD would also be an essential subject in this case, too.

According to the present invention, in a solid state image pickup device including a semiconductor substrate, a plurality of photodiodes provided on said semiconductor substrate, vertical CCDs which are provided on said semiconductor substrate for transferring signal charges of said photodiodes and a horizontal CCD which is provided on said semiconductor substrate for transferring signal charges received from said vertical CCDs, a structure is formed such that the horizontal CCD is formed in a well structure provided on the substrate, so that a depletion region extending from a channel and a depletion region produced between the substrate and the well meet each other under each one of the transfer electrodes, and a depletion region extending from a channel of the vertical CCDs and a depletion region produced between the substrate and the well do not meet each other under each of the transfer electrodes thereof.

When the depletion region formed under each of the electrodes and the depletion region produced at the interface between the p-well and the semiconductor substrate are such that they meet, an electric field in the same direction as the transfer direction of signal charges is generated in a part of the p-well. This electric field generated newly in the p-well exerts an influence upon the electric field (fringing field) in the direction of signal charge transfer at the center of the transfer gate from under the channel so as to operate in a direction to enlarge the same. As it was stated previously, an electric field having an effective influence which enlarges the electric field (fringing field) in the signal charge transfer direction from under the channel at the central portion of the transfer gate has been nonexistent according to that conventional, such as in the above example. That is, in the conventional example, although the electric field in the p-well under the channel at the central portion of the transfer gate is inclined slightly in the transfer direction of signal charges by being affected by the electric field in the channel, it points almost upward and is of little consequence insofar as enlarging the electric field (fringing field) in the signal charge transfer direction.

As described above, according to the present invention, an electric field in the same direction as the transfer direction of signal charges which could not exist in accordance with that conventional, as in the example described is generated newly, thus making it possible to provide a semiconductor device having a CCD in which the transfer speed of signal charges is improved and non-transferred charges are reduced thereby to improve the transfer efficiency.

It is an object of the present invention to solve the problems included in above-described prior art.

It is another object of the present invention to provide a semiconductor device having a CCD in which the transfer speed of signal charges has been improved during operation thereof.

It is still another object of the present invention to provide a semiconductor device having a CCD in which non-transferred charges are reduced so as to improve the transfer efficiency during operation thereof.

It is another object of the present invention to provide a two-dimensional solid state image pickup device including a vertical CCD and a horizontal CCD having preferred structures, respectively.

It is still another object of the present invention to provide a semiconductor device having a CCD in which the transfer speed of signal charges is improved and non-transferred charges are reduced, thereby to improve the transfer efficiency during operation thereof.

These and other objects and many of the attendant advantages of the present invention will be readily appreciated as the same becomes better understood by reference to the following detailed description when considered in connection with the accompanying drawings.

DESCRIPTION OF THE PREFERRED EMBODIMENTS

Embodiment 1

A first embodiment of the present invention will be explained with reference to FIG. 1, FIG. 2 and FIG. 3.

Figure 1:
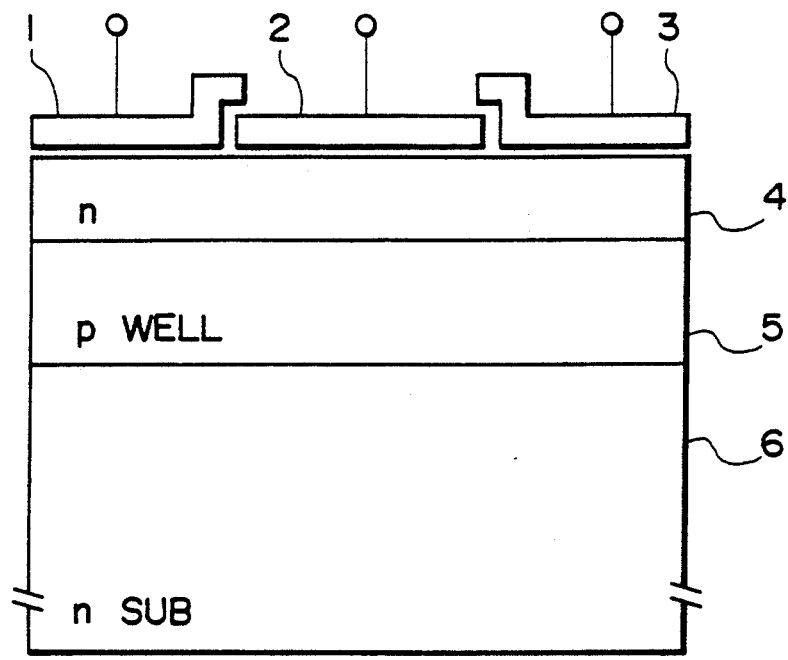
FIG. 1 is a sectional view of a CCD in an embodiment of the present invention which is parallel to the transfer direction of signal charges.

FIG. 1 is a sectional view of a CCD in the present embodiment which is parallel to a transfer direction of signal charges. A CCD consisting of a buried channel 4 and transfer gates 1, 2 and 3 is provided on a p-well 5 formed on an n-type substrate 6.

Figure 13:
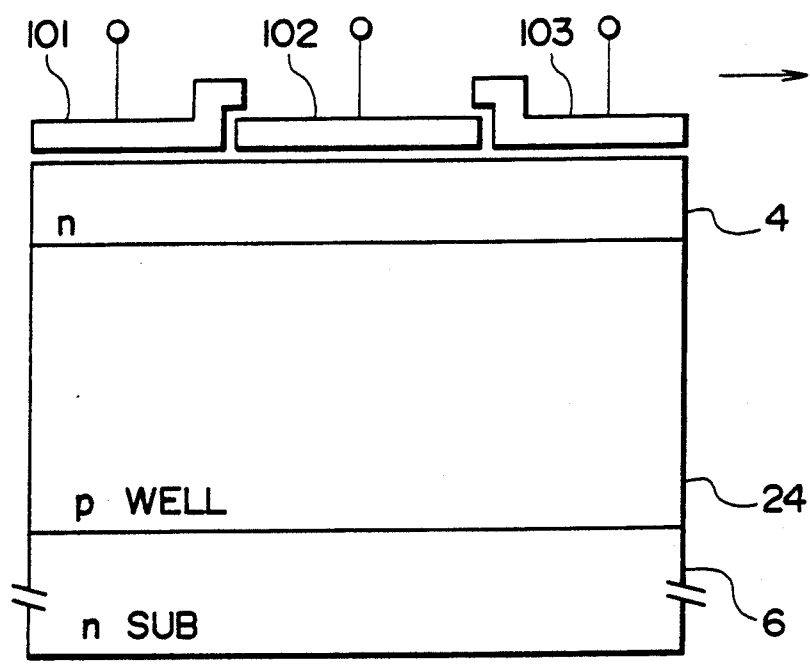
FIG. 13 is a sectional view of a CCD in a conventional example which is parallel to the transfer direction of signal charges.
Figure 14:
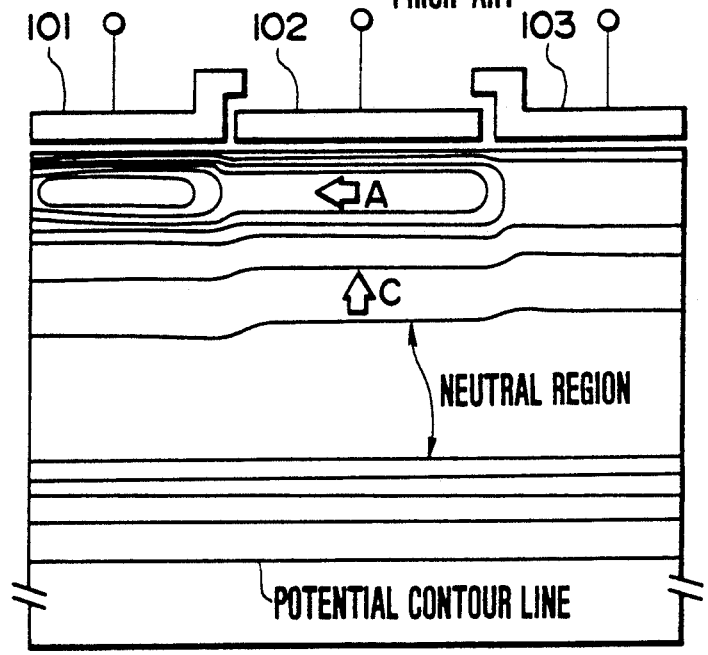
FIG. 14 is a diagram showing the potential profile in FIG. 13 using potential contour lines.

By applying a predetermined voltage to the transfer gates 1, 2 and 3, the buried channel 4 is depleted completely, and the potential of the buried channel 4 is set to a value which corresponds to the voltage of the transfer gates 1, 2 and 3 in the upper part. Since signal charges drift by means of an electric field formed by this potential, it is possible to transfer signal charges along the buried channel 4 by applying a predetermined voltage clock to the transfer gates 1, 2 and 3, which is similar to the conventional example which was explained with reference to FIG. 13. In the present embodiment, however, a depletion region produced in the buried channel 4 under the transfer gates 1, 2 and 3 and a depletion region produced at an interface between the p-well 5 and the n-type substrate 6 meet each other. In other words, the p-well 5 has been depleted.

Figure 2:
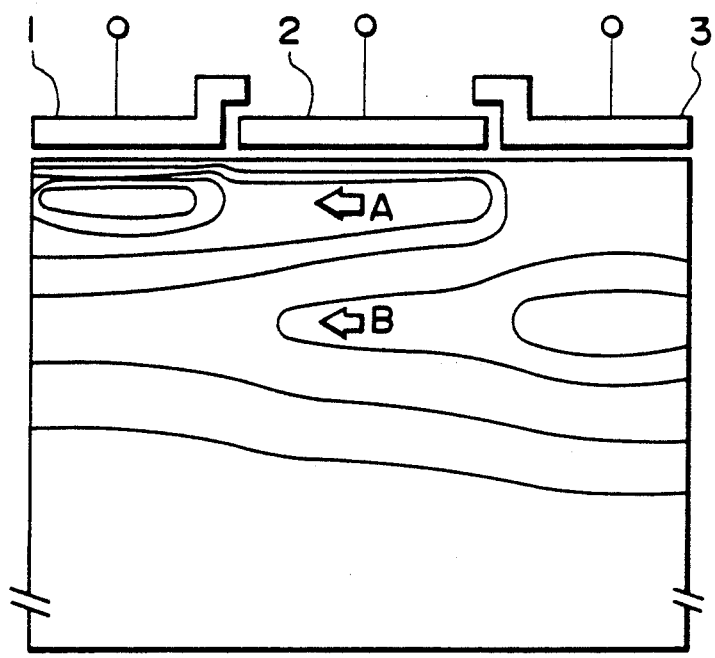
FIG. 2 is a diagram showing the potential profile in FIG. 1 using potential contour lines.

FIG. 2 shows a potential profile in FIG. 1 using potential contour lines. Although it is not shown in the figure, it is assumed that signal charges are in transit at this time and a high voltage is applied to respective transfer gates in accordance with the transfer gate order 1, 2 and 3. Further, arrow marks A and B show directions of electric fields at respective points.

As described previously, transfer of signal charges is performed by means of the electric field formed by the potential in the channel 4, and the transfer speed thereof is determined by the strength of the electric field (fringing field) in the transfer direction of signal charges at the center of the transfer gates. Here, when the depletion region formed under the electrodes and the depletion region produced at the interface between said semiconductor region of the first conductive type, that is, the p-well 5, and the semiconductor substrate 6 meet, an electric field in the same direction as the transfer direction of signal charges shown with the arrow mark B is produced in a portion in the p-well 5. This electric field which is newly generated in the p-well 5 exerts an influence from under the channel 4 upon the electric field (fringing field) in the transfer direction of signal charges in the channel 4 at the center of transfer gates shown with an arrow mark A, and acts in the direction of enlarging said electric field. The electric field in the direction shown with the arrow mark B which is able to strengthen or enlarge the electric field (fringing field) in the transfer direction of signal charges from the region under the channel 4 at the central portion of the transfer gates as described above, has thus far not been existent in accordance with that conventional including the discussed example. That is, in the conventional example, although the electric field in the p-well 5 (that is, p-well 24 in FIG. 13) under the channel 4 at the central portion of the transfer gates is inclined slightly in the transfer direction of signal charges by the influence of the electric field in the channel 4, it points almost upward and is thus of little consequence insofar as enlarging the electric field (fringing field) in the transfer direction of signal charges shown with the arrow mark A. In contrast to the above, in the present embodiment, it is possible to improve the transfer speed of signal charges remarkably and to reduce non-transferred charges so as to improve the transfer efficiency of a CCD by producing newly an electric field in the same direction as the transfer direction of signal charges which could not be existent in a conventional example.

Figure 3:
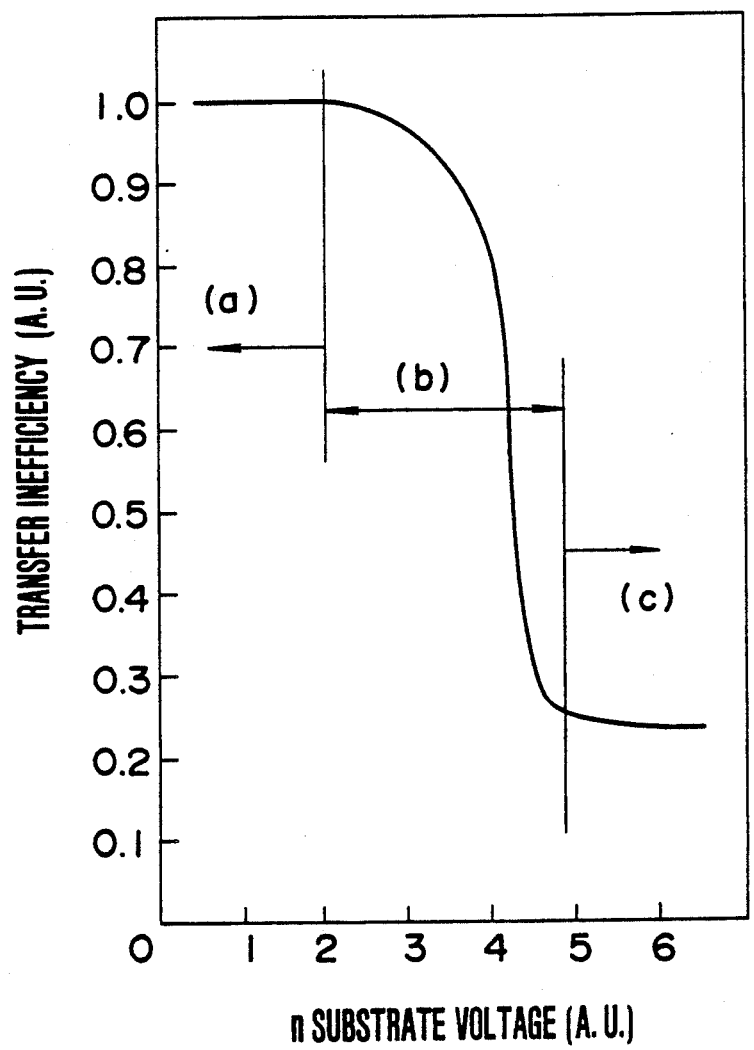
FIG. 3 is a diagram showing computer analysis of n-type substrate voltage dependency of non-transferred charge quantity with regard to structures shown in FIG. 1 and FIG. 2.

In the next place, FIG. 3 shows results of computer analysis of voltage dependence of non-transferred charge quantity on the n-type substrate 6 with respect to the structure shown in FIGS. 1 and 2. As the voltage of the n-type substrate 6 is increased, the p-well 5 becomes depleted. Three regions (a), (b) and (c) are shown in FIG. 3 depending on the state of such depletion, but the following is comprehended evidently. That is, when a part of the p-well is depleted, the non-transferred charge quantity drops rapidly and further, when the p-well is depleted completely, the value of the non-transferred charge quantity is settled down at a constant value. With the foregoing, not only the effect by reduction in the non-transferred charge quantity by depleting the whole of the p-well can be confirmed, but also the effect of reduction in the non-transferred charge quantity by depleting a part of the p-well can be confirmed.

Embodiment 2

A second embodiment of the present invention will be explained hereafter with reference to FIG. 4, FIG. 5A, FIG. 5B, FIG. 6A, FIG. 6B and FIG. 10.

Figure 4:
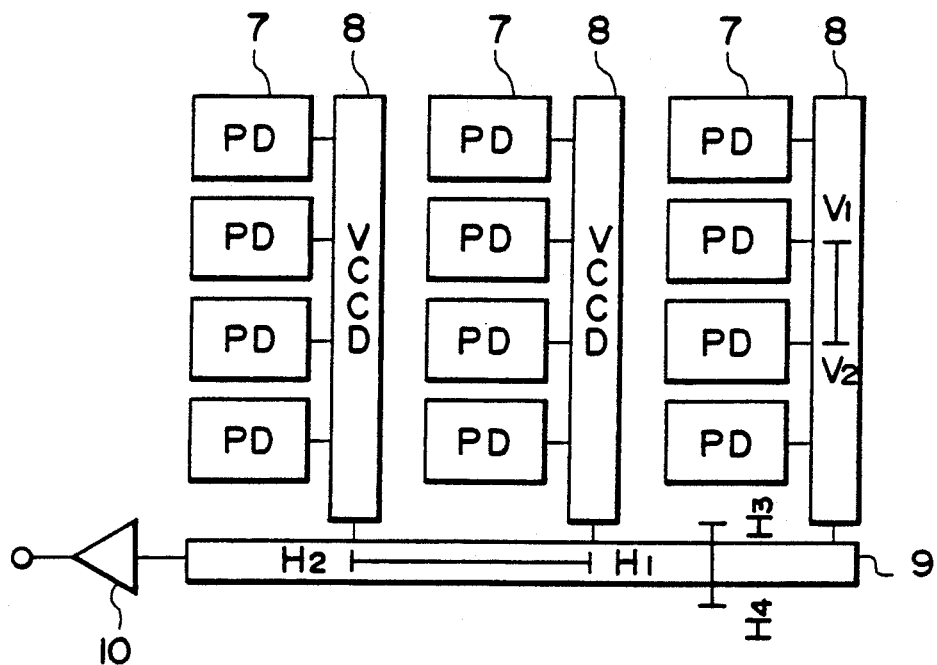
FIG. 4 is a composition diagram of an interline CCD type solid state image pickup device according to an embodiment of the present invention.

FIG. 4 is a composition diagram of an interline CCD type solid state image pickup device according to the present embodiment. Photodiodes 7 are connected to vertical CCDs 8 which extend in a direction perpendicular to a light receiving plane. Further, one end of each vertical CCD 8 is connected to a horizontal CCD 9, and an output amplifier 10 is provided at one end of the horizontal CCD.

Signal charges converted photoelectrically from incident light in the photodiodes 7 are read into the vertical CCDs 8 within the vertical blanking period and transferred toward the horizontal CCD 9 step by step in the vertical CCDs 8 within the horizontal blanking period. In due time, signal charges which have been read into the CCD 9 are transferred to the output amplifier 10 successively in synchronization with horizontal scanning, thus producing an output signal.

Figure 5A:
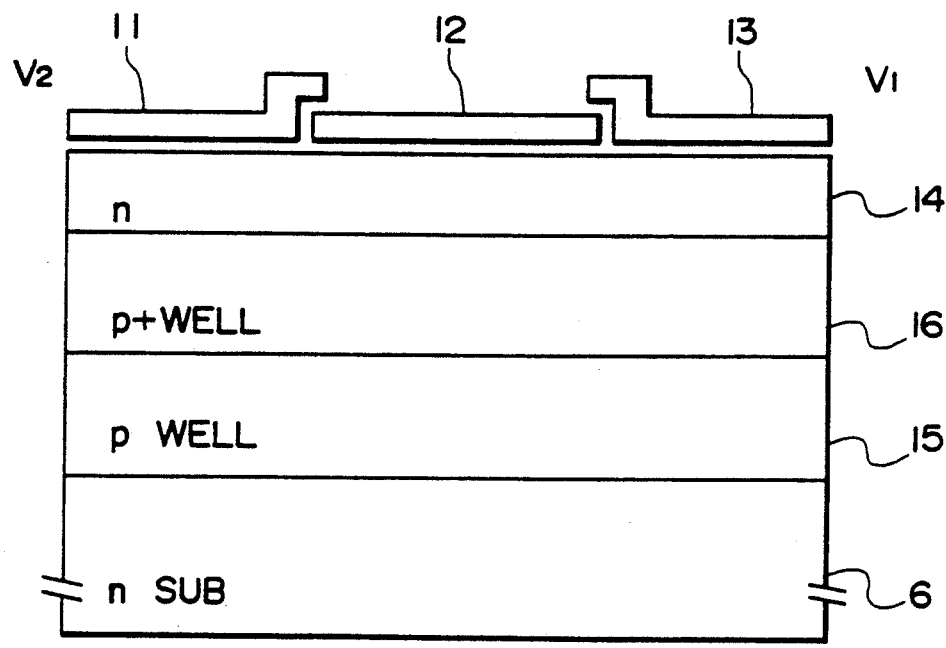
FIG. 5A is a sectional view between V1–V2 in FIG. 4.

FIG. 5A is a sectional view between V1–V2 of a vertical CCD 8 shown in FIG. 4. In FIG. 5A, a CCD consisting of a buried channel 14 and transfer gates 11, 12 and 13 is provided on a p-well 15 and a shallow p+ well 16 formed on the n-type substrate 6.

By applying a predetermined voltage to the transfer gates 11, 12 and 13, the buried channel 14 is depleted completely, and the potential of the buried channel 14 is set to a value which corresponds to the voltage of the transfer gates 11, 12 and 13 in the upper part. Since signal charges drift by means of the electric field formed by this potential, it is possible to transfer signal charges along the buried channel 14 by applying a predetermined voltage pulse to the transfer gates 11, 12 and 13, which is similar to the embodiment explained with reference to FIG. 1. In the present embodiment, however, a depletion region produced in the buried channel 14 under the transfer gates 11, 12 and 13 and a depletion region produced at the interface between the p-well 15 and the n-type substrate 6 are separated by means of a double well structure of the p-well 15 and a shallow p+ well 16, and the well has not been depleted.

Figure 5B:
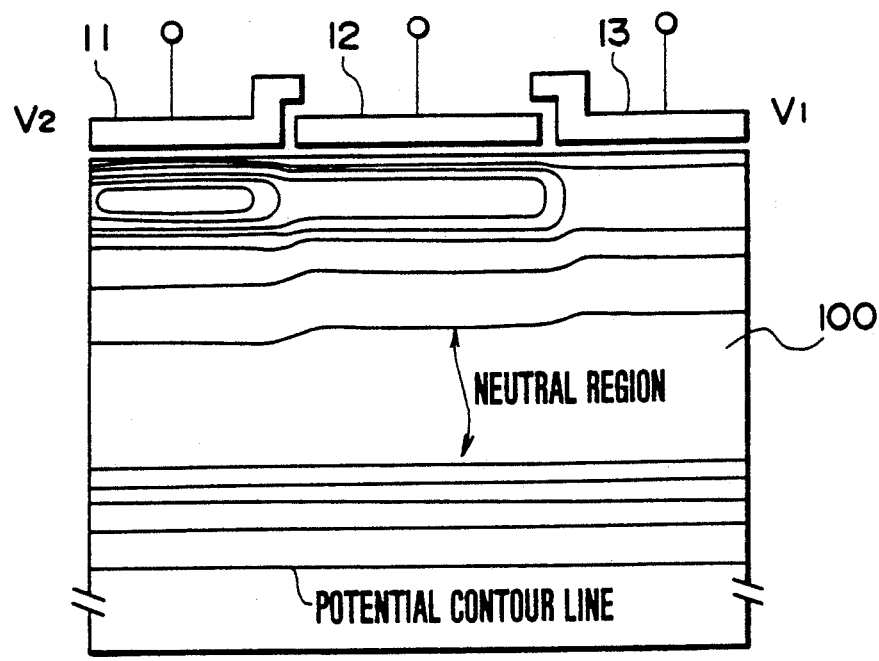
FIG. 5B is a diagram showing the potential profile in FIG. 5A using potential contour lines.

In order to explain the foregoing, FIG. 5B shows the potential profile in FIG. 5A using potential contour lines. Although it is not shown, it is assumed that signal charges are in transit at this time, and a high voltage is applied to the respective transfer gates in accordance with the transfer gate order of 11, 12 and 13. As described previously, the depletion region produced in the buried channel 14 under the transfer gates 11, 12 and 13 and the depletion region produced at the interface between the p-well 15 and the n-type substrate 6 are separated by means of a neutral region 100. That is, the well is not depleted, which is caused for the following reason. As shown in FIG. 4, vertical CCDs 8 are arranged in parallel on the light receiving plane. Accordingly, if the well is depleted completely under these vertical CCDs 8, the neutral region of the well is divided into long strip shapes by the vertical CCDs 8, and the resistance value of the well is increased substantially. As the result, since the potential at the center of the well in particular varies very easily by the capacitive coupling with the transfer gates, it becomes harder to read signal charges at the central portion of the well from the photodiodes 7, thus causing deterioration in S/N of picture. Because of the reasons described above, complete depletion of the well under the vertical CCDs 8 should be avoided. Furthermore, as described previously, signal charge transfer in the horizontal CCD 9 is performed at a high speed in synchronization with horizontal scanning, but, on the other hand, signal charge transfer in the vertical CCDs 8 is performed at a comparatively low speed, being step by step within the horizontal blanking period. Therefore, the requirement for improving the transfer speed and the transfer efficiency of signal charges with respect to the vertical CCDs 8 is small. Thus, it is understood that it is more preferable rather to have a larger neutral region of the well under the vertical CCDs 8.

Figure 6B:
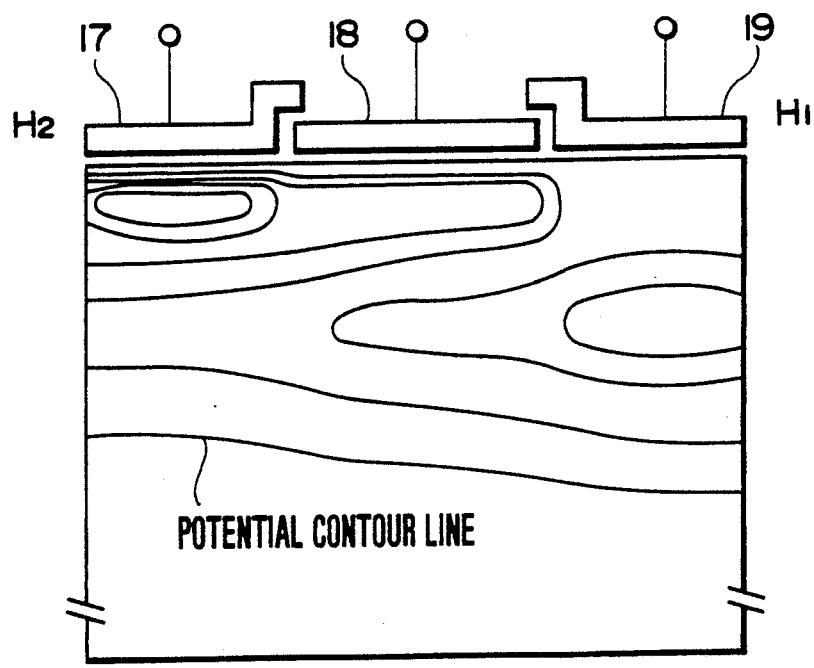
FIG. 6B is a diagram showing the potential profile in FIG. 6A using potential contour lines.
Figure 6A:
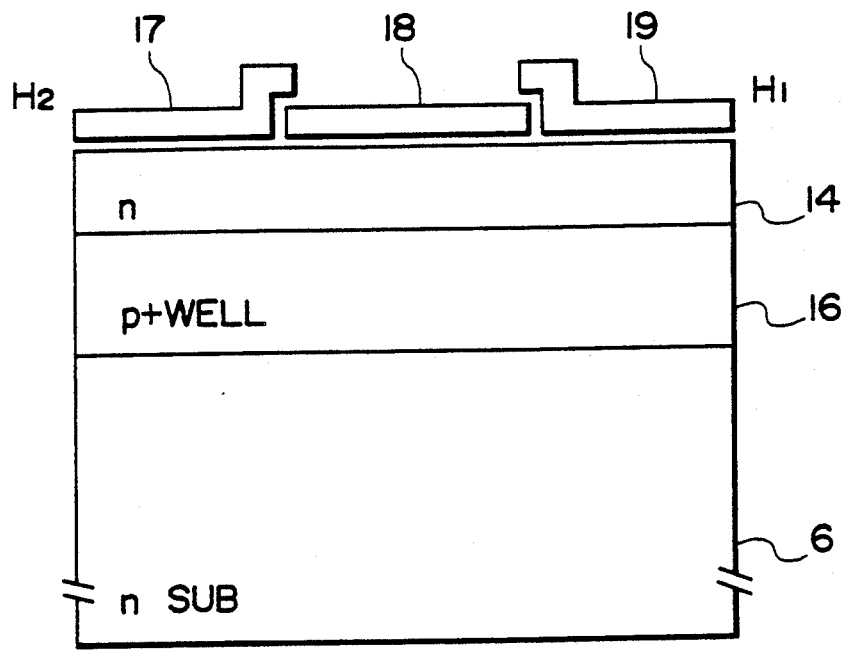
FIG. 6A is a sectional view between H1–H2 in FIG. 4.

Next, FIG. 6A shows a sectional view between H1–H2 of the horizontal CCD 9 in FIG. 4. In FIG. 6A, a CCD consisting of a buried channel 14 and transfer gates 17, 18 and 19 is provided on a shallow p+ well 16 formed on the n-type substrate 6. Here, the p-well 15 which has been provided under the vertical CCDs 8 is not provided in this horizontal CCD 9.

By applying a predetermined voltage to the transfer gates 17, 18 and 19, the buried channel 14 is depleted completely, and the potential of the buried channel 14 is set to a value which corresponds to the voltage of the transfer gates 17, 18 and 19 in the upper part. Since signal charges drift by means of the electric field formed by this potential, it is possible to transfer signal charges along the buried channel 14 by applying a predetermined voltage pulse to the transfer gates 17, 18 and 19, which is similar to the embodiment explained with reference to FIG. 1. Since there is no p-well 15 which has been provided under the vertical CCDs 8 in the horizontal CCD 9, the well under the channel can be depleted more easily than the case of vertical CCDs 8. In the present embodiment, the depletion region produced in the buried channel 14 under the transfer gates 17, 18 and 19 and the depletion region produced at the interface between the shallow p+ well 16 and the n-type substrate 6 meet each other.

In order to explain the foregoing, FIG. 6B shows the potential profile in FIG. 6A using potential contour lines. Although it is not shown, it is assumed that signal charges are in transit at this time, and a high voltage is applied to respective transfer gates in accordance with the transfer gate order of 17, 18 and 19. As shown in the figure, the shallow p+ well 16 has been depleted.

Figure 10:
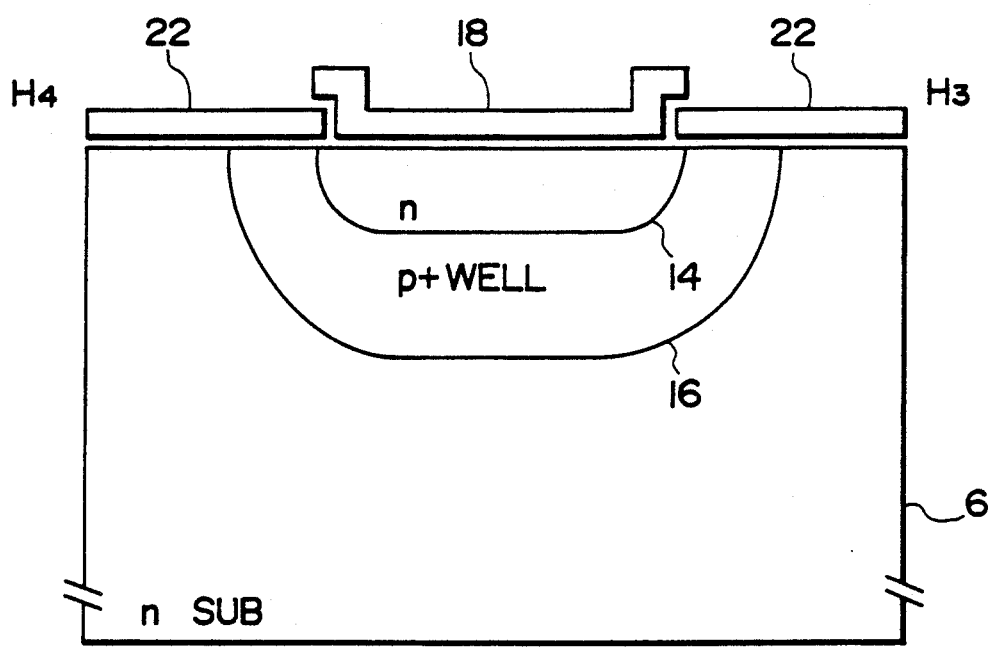
FIG. 10 is a sectional view between H3–H4 in FIG. 4.

Next, FIG. 10 shows a sectional view between H3-H4 of the horizontal CCD 9 in FIG. 4 in a direction transverse to that of signal charge transfer. With FIG. 10, it is understood that separation of the horizontal CCD 9 is made by means of a field plate 22 provided on the element surface, and that the shallow p+ well 16 is provided only in the vicinity of the buried channel 14 and is in contact with the n-type substrate 7 at the side face thereof as well as at the bottom face thereof. At this time, the depletion region produced in the buried channel 14 under the transfer gate 18 and the depletion region produced at the interface between the shallow p+ well 16 and the n-type substrate 6 are connected with each other at the side face of the shallow p+ well 16 as well as at the bottom face thereof. Thus, it is possible to enlarge the electric field (fringing field) at the center of the transfer gate 18 considerably by depleting the shallow p+ well 16 both at the bottom face and the side face as described above. That is, according to the present embodiment, it is possible to improve the transfer speed of signal charges in the horizontal CCD 9 remarkably and to reduce the non-transferred charge quantity.

Besides, the shallow p+ well 16 is depleted both at the bottom face and the side face as described with reference to FIG. 10 in the present embodiment. However, it is needless to say that improvement effects of characteristics of the horizontal CCD 9 pursuant to the present embodiment may be expected by forming a p-type impurity diffused layer under the field plate 22, performing separation of the horizontal CCD 9 using a LOCOS (Local Oxidation of Silicon) method and so forth even if depletion at the side face of the shallow p+ well 16 is hindered.

Besides, in the present embodiment, impurities diffused in the buried channel 14 of the horizontal CCD 9 vary only for the portion of the p-well 15 as compared with impurities diffused in the buried channel 14 of the vertical CCD 8. Since the impurity concentration of the p-well 15 is of much lower concentration as compared with that of the buried channel 14, the channel potential of the horizontal CCD 9 is almost the same as that of the vertical CCD 8. Accordingly, there is such an advantage in the present embodiment that voltage elevation of the output amplifier with the increase of the channel potential of the horizontal CCD 9 may be avoided.

Embodiment 3

Figure 7:
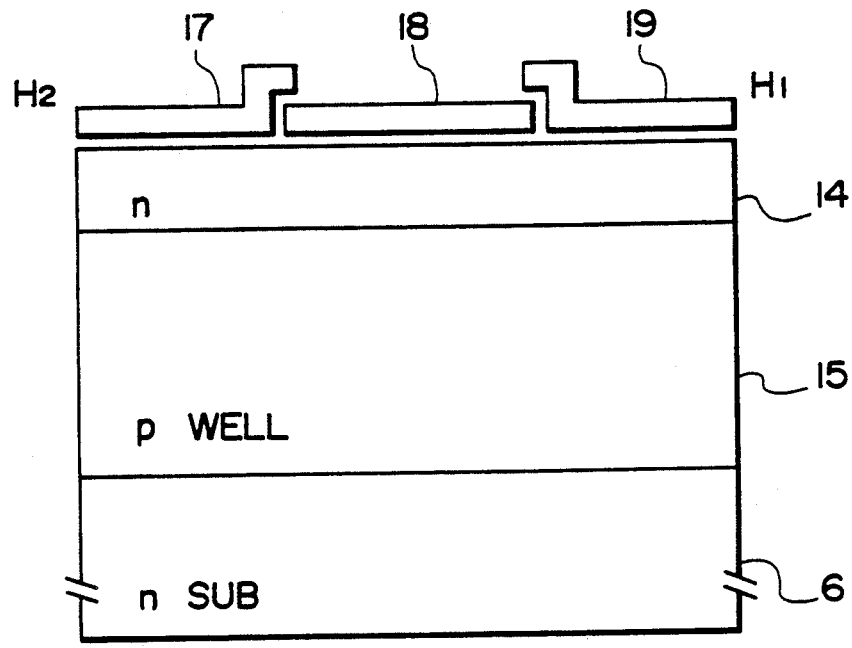
FIG. 7 is a sectional view of a CCD in another embodiment of the present invention which is parallel to the transfer direction of signal charges.

A third embodiment of the present invention will be explained with reference to FIG. 7.

A composition diagram of an interline CCD type solid state image pickup device according to the present invention, a sectional view of a vertical CCD thereof and the like are omitted since the structure is the same as that described with respect to the embodiment 2. FIG. 7 is a sectional view which is parallel to the transfer direction of signal charges of the horizontal CCD 9 of an interline CCD type solid state image pickup device according to the present embodiment and corresponds to FIG. 6A used in the explanation of the Embodiment 2. The composition shown in FIG. 7 is similar to that shown in FIG. 6A except that the shallow p+ well 16 is substituted with the p-well 15. In the present embodiment, the shallow p+ well 16 which has been provided under the vertical CCDs 8 is removed in the horizontal CCD 9 so that the well under the channel may be depleted more easily than that under the vertical CCDs 8. In the present embodiment, the depletion region produced in the buried channel 14 under the transfer gates 17, 18 and 19 and the depletion region produced at the interface between the p-well 15 and the n-type substrate 6 also meet. In other words, the p-well 15 is depleted. With this, it is possible to enlarge the electric field (fringing field) at the center of the transfer gate 18, and also to improve the transfer speed of signal charges in the horizontal CCD 9 substantially and reduce the non-transferred charge quantity.

Embodiment 4

Figure 8:
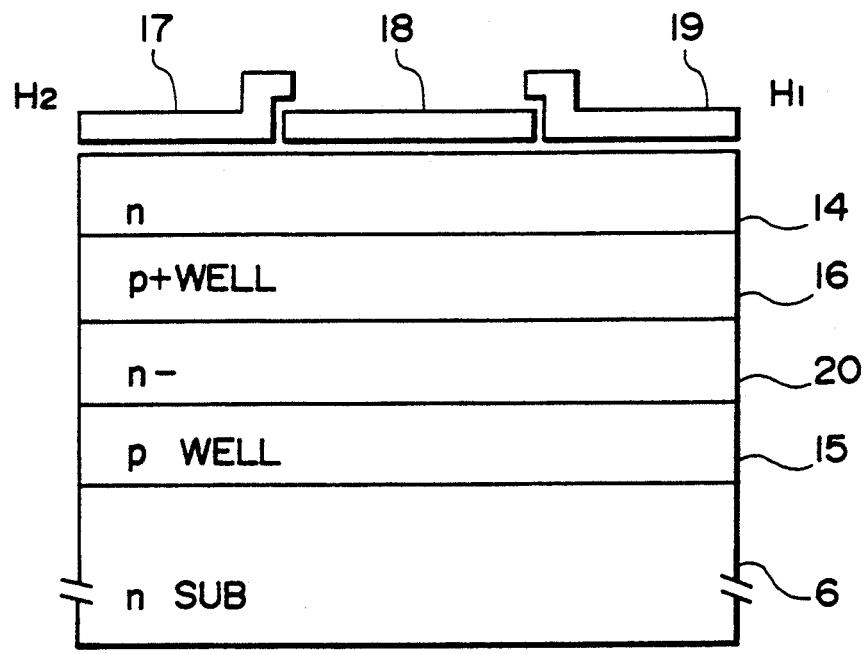
FIG. 8 is a sectional view of the CCD in another embodiment of the present invention which is parallel to the transfer direction of signal charges.

A fourth embodiment of the present invention will be explained hereafter with reference to FIG. 8 and FIG. 11.

A composition diagram of an interline CCD type solid state image pickup device according to the present invention, a sectional view of a vertical CCD thereof and the like are omitted since the structure is the same as that described with respect to the Embodiment 2. FIG. 8 is a sectional view which is parallel to the transfer direction of signal charges of the horizontal CCD 9 of an interline CCD type solid state image pickup device according to the present embodiment and corresponds to FIG. 6A used in the explanation of the Embodiment 2. The composition shown in FIG. 8 is similar to that shown in FIG. 6A except that a deep n-type impurity diffused layer 20 is newly provided. In the present embodiment, the well under the channel of the horizontal CCD 9 is made to be depleted more easily than that under the CCD 8 by providing in the horizontal CCD 9 the deep n-type impurity diffused layer 20 which does not exist under the vertical CCDs 8. In the present embodiment, the well under the channel of the horizontal CCD 9 is also depleted and the depletion region produced in the buried channel 14 under the transfer gates 17, 18 and 19 and the depletion region produced at the interface between the p-well 15 and the n-type substrate 6 meet and, on the other hand, the well under the channel of the vertical CCDs 8 is not depleted.

Figure 11:
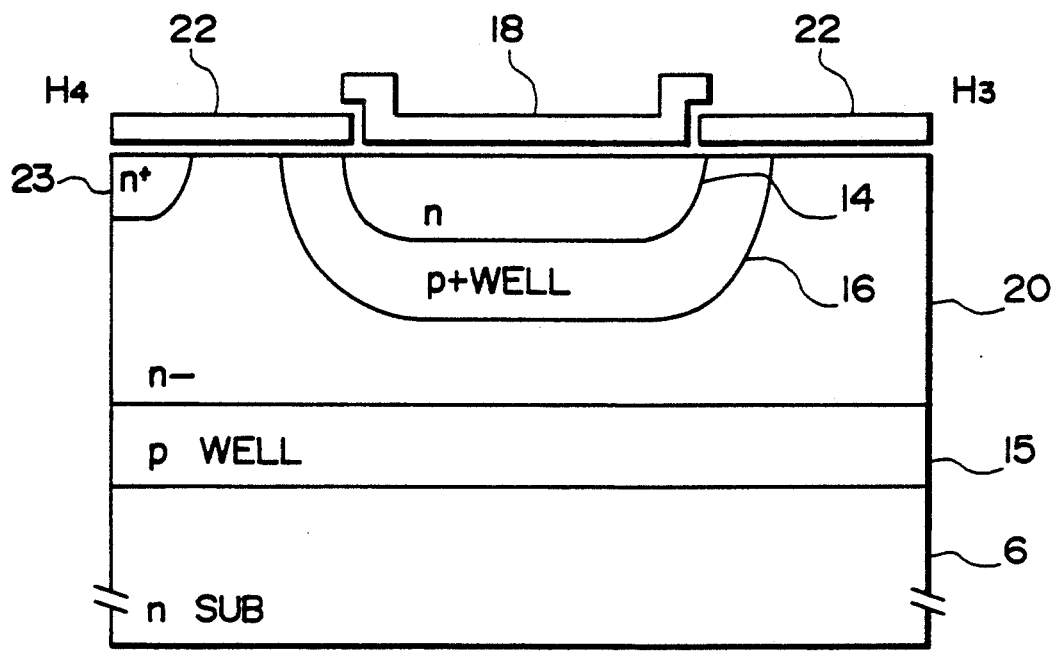
FIG. 11 is a sectional view which corresponds to the sectional view between H3–H4 in FIG. 4 in another embodiment of the present invention.

Next, in the present embodiment, FIG. 11 corresponds to the sectional view of H3-H4 in FIG. 4 used for explaining the Embodiment 2. With FIG. 11, it is understood that separation of the horizontal CCD 9 is made by means of the field plate 22 provided on the element surface, and that the shallow p+ well 16 is provided only in the vicinity of the buried channel 14 and the shallow p+ well 16 is in contact with a deep n-type impurity diffused layer 20 at the side face as well as at the bottom face thereof. The depletion region produced in the buried channel 14 under the transfer gate 18 and the depletion region produced at the interface between the p-well 15 and the n-type substrate 6 meet at the side face of the p+ well 16 similarly to the bottom face thereof. By depleting the shallow p+ well 16 both at the bottom face and the side face, it is possible to enlarge the electric field (fringing field) at the center of the transfer gate 18 substantially also in the present invention similarly to the Embodiment 2. That is, according to the present embodiment, it is possible to improve the transfer speed of signal charges in the horizontal CCD 9 remarkably and also to reduce the non-transferred charge quantity.

Besides, in FIG. 11, a drain 23 composed of an n+ diffused layer is provided under the field plate 22. This is a structure for preventing a dark current generated under the field plate 22 from leaking into the horizontal CCD 9, and the same voltage as the n-type substrate 6 or an appropriate positive constant voltage is applied to this drain 23.

It is needless to say that the effects of improvement of characteristics of the horizontal CCD pursuant to the present embodiment may be expected in the present invention similarly to the case of the Embodiment 2 even if depletion of the shallow p+ well 16 on the side face thereof is hindered.

Besides, in the present embodiment, impurities diffused in the buried channel 14 of the horizontal CCD 9 vary only for the portion of the deep n-type impurity diffused layer 20 as compared with the impurities diffused in the buried channel 14 of the vertical CCDs 8. Accordingly, when the impurity concentration of the deep n-type impurity diffused layer 20 is made sufficiently thin as compared with that of the buried channel 14, it is possible to set the channel potential of the horizontal CCD 9 almost the same as that of the vertical CCDs 8. Thus, voltage elevation of the output amplifier with build-up of the channel potential of the horizontal CCD 9 can be avoided. Furthermore, there is such an advantage in the present embodiment that the degree of depletion of the well can be adjusted without exerting an influence upon other device characteristics by controlling the impurity concentration and the depth of diffusion of the deep n-type impurity diffused layer 20.

Next, the impurity concentration of abovesaid deep n-type impurity diffused layer 20 will be described. It is assumed that the impurity concentration of the n-type substrate 6 is a uniform concentration in the order of approximately $5 \times 10^{14}$ (1/cm$^2$). This n-type substrate 6 may be one in which monocrystal Si is grown by an ordinary CZ method (Czochralski technique), one in which monocrystal Si is grown further epitaxially thereon, or one in which monocrystal Si is grown using a MCZ method (magnetic-field-applied Czochralski technique). In the next place, it is assumed that the impurity distribution in the p-well 15 is a Gauss distribution in which the dose is at $3 \times 10^{11}$ to $3 \times 10^{12}$ (1/cm$^2$) and the depth xj from the Si surface where the impurity concentration reaches the same as that of the n-type substrate 6 is at 3 to 5 $\mu$m. Furthermore, it is assumed that the impurity distribution of the shallow p+ well 16 is Gauss distribution in which the dose is at $3 \times 10^{12}$ to $6 \times 10^{12}$ (1/cm$^2$) and the depth xj from the Si surface where the impurity concentration reaches the same as that of the n-type substrate 6 is at 1 to 1.5 $\mu$m, and that the impurity distribution of the buried channel 14 is a Gauss distribution in which the dose is at $3 \times 10^{12}$ to $3 \times 10^{13}$ (1/cm$^2$) and the depth xj from the Si surface where the impurity concentration reaches the same as that of the n-type substrate 6 is at 0.5 to 1.0 $\mu$m. When it is assumed at this time that abovesaid deep n-type impurity diffused layer 20 has the Gauss distribution in which the dose is at $1 \times 10^{11}$ to $1 \times 10^{12}$ (1/cm$^2$) and the depth xj from the Si surface where the impurity concentration reaches the same as that of the n-type substrate 6 is at 1 to 3 $\mu$m, it is possible as described previously to deplete the well under the channel of the horizontal CCD 9, and to connect the depletion region produced in the buried channel 14 under the transfer gates 17, 18 and 19 with the depletion region produced at the interface between the p-well 15 and the n-type substrate 6 and, on the other hand, it is also possible to make the channel potential of the horizontal CCD 9 almost the same as that of the vertical CCDs 8. Accordingly, it is possible to improve the transfer speed of signal charges in the horizontal CCD 9 substantially and to reduce the non-transferred charge quantity while avoiding voltage elevation of the output amplifier with the build-up of the channel potential of the horizontal CCD 9.

Embodiment 5

Figure 9:
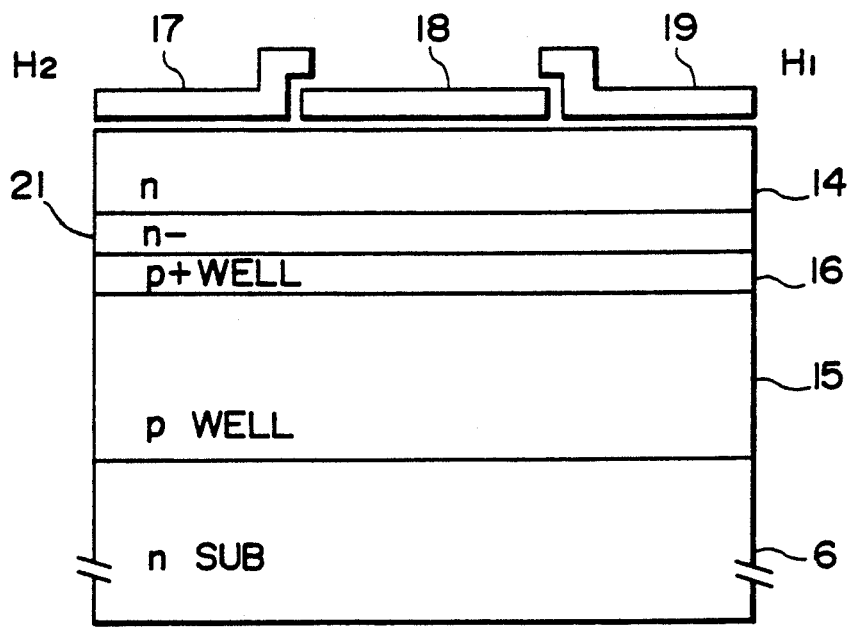
FIG. 9 is a sectional view of a CCD in another embodiment of the present invention which is parallel to the transfer direction of signal charges.

A fifth embodiment of the present invention will be explained hereafter with reference to FIG. 9.

A composition diagram of an interline CCD type solid state image pickup device according to the present invention, a sectional view of a vertical CCD thereof and the like are omitted since the structure is the same as that described with respect to the Embodiment 2. FIG. 9 is a sectional view which is parallel to the transfer direction of signal charges of the horizontal CCD 9 of an interline CCD type solid state image pickup device according to the present embodiment and corresponds to FIG. 6A used in the explanation of the Embodiment 2. The composition shown in FIG. 9 is similar to that shown in FIG. 6A except that a shallow n-type impurity diffused layer 21 is newly provided. In the present embodiment, the well under the channel of the horizontal CCD 9 is made to be depleted more easily than that of the vertical CCD 8 by providing the shallow n-type impurity diffused layer 21 which is not included under the vertical CCDs 8 in the horizontal channel 9. In the present embodiment, the depletion region produced in the buried channel 14 under the transfer gates 17, 18 and 19 and the depletion region produced at the interface between the p-well 15 and the n-type substrate 6 also meet. With this, it is possible to enlarge the electric field (fringing field) at the center of the transfer gate 18, and also to improve the transfer speed of signal charges in the horizontal CCD 9 substantially and reduce the non-transferred charge quantity.

Besides, according to the present embodiment, there is such an advantage that it is possible to adjust the degree of depletion of the well without exerting an influence upon other device characteristics by controlling the impurity concentration and the depth of diffusion of the shallow n-type impurity diffused layer 21.

Embodiment 6

Figure 12:
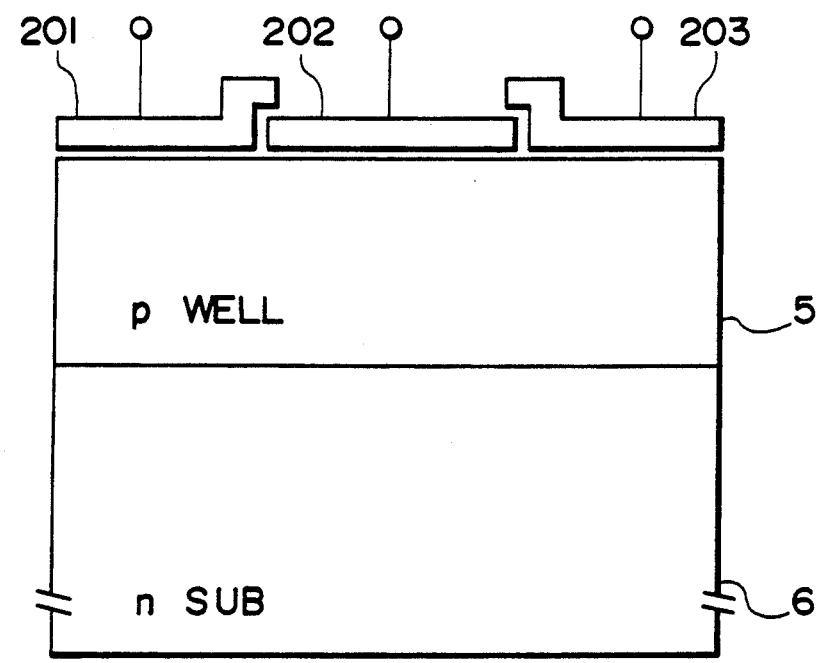
FIG. 12 is a sectional view of a CCD in another embodiment of the present invention which is parallel to the transfer direction of signal charges.

A sixth embodiment of the present invention will be explained hereafter with reference to FIG. 12. FIG. 12 is a sectional view of a CCD in the present embodiment which is parallel to the transfer direction of signal charges. A CCD consisting of transfer gates 201, 202 and 203 is provided on a p-well 5 formed on the n-type substrate 6.

By applying a predetermined voltage to the transfer gates 201, 202 and 203, the surface of the p-well 5 is depleted, and the potential on the surface of the p-well 5 is set to a value corresponding to the voltage of the transfer gates 201, 202 and 203 in the upper part. Since signal charges drift by means of the electric field formed by this potential, it is possible to transfer signal charges along the channel produced on the surface of the p-well 5 by applying a predetermined voltage pulse to the transfer gates 201, 202 and 203. Here, in the present embodiment, the depletion region produced on the surface of the p-well 5 under the transfer gates 201, 202 and 203 and the depletion region produced along the interface between the p-well 5 and the n-type substrate 6 are connected with each other so as to deplete the p-well 5. As described previously, it is also possible to improve the transfer speed of signal charges substantially and to reduce the non-transferred charge quantity in the present embodiment.

According to the present invention, it is possible to improve the transfer speed of signal charges and to reduce non-transferred charges thereby to improve the transfer efficiency of a semiconductor device including CCDs by having the electric field in the p-well under the channel serve to improve the fringing field, i.e. have a magnifying effect.

It is further understood by those skilled in the art that the foregoing description is a preferred embodiment of the disclosed device and that various changes and modifications may be made in the invention without departing from the spirit and scope thereof.

It is apparent by way of an example that the same effects of the present invention may be attained when the p-type and the n-type of the impurity structures in respective semiconductors are replaced with each other in said (plurality of) embodiments.

What is claimed is:

1. A semiconductor device, comprising:
   a semiconductor substrate;
   a plurality of photodiodes provided on said semiconductor substrate;
   vertical charge coupled devices (CCDs) provided on said semiconductor substrate and transferring signal charges of said photodiodes; and
   a horizontal charge coupled device (CCD) provided on said semiconductor substrate and transferring signal charges received from said vertical CCDs,
   wherein said horizontal CCD includes:
   a semiconductor region of a first conductivity type provided on said semiconductor substrate which is of a second conductivity type;
   a semiconductor region of the second conductivity type, wherein a channel for charge transfer is formed, provided on said semiconductor region of the first conductivity type;
   a plurality of electrodes formed on said semiconductor region of the second conductivity type through an insulating film;
   first means for applying a predetermined voltage to said plurality of electrodes successively for transferring signal charges composed of a majority carrier in the semiconductor region of the second conductivity type in a depletion region formed under these electrodes; and
   second means for applying between said semiconductor region of the first conductivity type and said semiconductor substrate a predetermined voltage so as to produce a depletion region at an interface between said semiconductor substrate and said semiconductor region of the first conductivity type,
   the depletion region formed under said electrodes and the depletion region provided at the interface between said semiconductor region of the first conductivity type and said semiconductor substrate meet each other under each one of said plurality of electrodes to thereby enhance the electric field produced for charge transfer in a transfer direction, through the channel, of said signal charges in the depletion region of said semiconductor region of the second conductivity type under said plurality of electrodes, and
   wherein said vertical CCDs, which respectively include a corresponding plurality of electrodes, are characterized such that in each one thereof there is produced a depletion region corresponding to the channel which is configured to not meet, under each one of the plurality of electrodes thereof, the depletion region produced at an interface between a corresponding semiconductor region of the first conductivity type and said semiconductor substrate, which interface underlies the channels of said vertical CCDs.

2. A semiconductor device according to claim 1, wherein in said horizontal CCD the depletion region formed under said plurality of electrodes and the depletion region produced at the interface between said semiconductor region of the first conductivity type and said semiconductor substrate are configured so that they meet each other over the whole bottom face of the channel underlying each one of the plurality of electrodes thereof.

3. A semiconductor device according to claim 1, wherein in each one of said vertical CCDs the semiconductor region of said first conductivity type is comprised of a two-layer stacked structure of the same conductivity type and that the impurity concentration of the upper layer thereof is higher than the impurity concentration of the lower layer thereof.

4. A semiconductor device comprising:
   a semiconductor substrate of a first conductivity type;
   a well region of a second conductivity type provided on said semiconductor substrate;
   first means for applying a predetermined voltage between said semiconductor substrate and said well region so as to produce a first depletion region at an interface between them;
   a plurality of photoelectric conversion elements provided on said semiconductor substrate;
   a plurality of first charge coupled devices (CCDs), formed on said semiconductor substrate, for transferring optical signal charges stored in said photoelectric conversion elements in a first direction, each first CCD including a channel layer and a plurality of electrodes for providing charge transfer;

a second charge coupled device (CCD), formed on said well region, for transferring optical signal charges transferred thereto by said plurality of first charge coupled devices in a second direction which is at right angles with the first direction with respect to a common plane extending in parallel to an upper principal surface of said semiconductor substrate, said second CCD including a plurality of electrodes for providing charge transfer; and second means for applying a predetermined voltage to a channel layer included in said second CCD to produce a second depletion region, wherein said second depletion region, corresponding to the channel layer of said second CCD, is configured to meet said first depletion region, under each one of the plurality of electrodes thereof, to provide an enhanced electric field for charge transfer in the channel layer of said second CCD during transfer of said signal charges, and wherein a third depletion region which extends from the channel of each of said first CCDs is precluded from meeting said first depletion region during charge transfer in said first CCDs.

5. A semiconductor device according to claim 4, wherein said second depletion region is extended from the channel layer of said second CCD into said semiconductor substrate covering the entire underlying region of the channel layer during transfer of signal charges as a result of said second depletion region meeting said first depletion region under each one of the plurality of electrodes thereof.

6. A semiconductor device according to claim 4, wherein said second depletion region is extended from the channel layer of said second CCD into said semiconductor substrate along the whole periphery of the channel during transfer of signal charges as a result of said second depletion region meeting said first depletion region under each one of the plurality of electrodes thereof.

7. A semiconductor device according to claim 4, wherein an impurity diffused layer of the first conductivity type which is not existent in well regions of the second conductivity type where said first CCDs are provided is provided additionally in the well region of the second conductivity type where said second CCD is provided.

8. A semiconductor device according to claim 4, wherein well regions of the second conductivity type which are included where said first CCDs are provided are respectively comprised of a plurality, corresponding to an integer N, of impurity layers of the second conductivity type, and that the well region of the second conductivity type where said second CCD is provided is comprised of piling of impurity diffused layers of the second conductivity type in a quantity less than the integer N or a single impurity diffused layer of the second conductivity type.

9. A semiconductor device according to claim 3, wherein each of said vertical CCDs further include:

a plurality of electrodes formed on a further semiconductor region of the second conductivity type, corresponding to a channel forming region, provided on the upper layer of said semiconductor region of said first conductivity type, wherein said lower layer is provided on said semiconductor substrate, and wherein the depletion region, extended from the channel thereof, produced during transfer of signal charges is prevented from meeting the depletion region produced at the interface between said lower layer and said semiconductor substrate by the presence of said upper layer.

10. A semiconductor device according to claim 8, wherein said first and second conductivity type are p-type and n-type, respectively.

11. A semiconductor device according to claim 1, wherein said first and second conductivity type are p-type and n-type, respectively.

12. A semiconductor device according to claim 6, wherein well regions of the second conductivity type which are included where said first CCDs are provided are respectively comprised of a plurality, corresponding to an integer N, of impurity layers of the second conductivity type, and that the well region of the second conductivity type where said second CCD is provided is comprised of piling of impurity diffused layers of the second conductivity type in a quantity less than the integer N.

13. A semiconductor device according to claim 6, wherein well regions of the second conductivity type which are included where said first CCDs are provided are respectively comprised of a plurality, corresponding to an integer N, of impurity layers of the second conductivity type, and that the well region of the second conductivity type where said second CCD is provided is comprised of a single impurity diffused layer of the second conductivity type.

14. A semiconductor device according to claim 13, wherein each plurality of N impurity layers includes a two-layer vertically stacked structure of the second conductivity type, the upper layer thereof having a higher impurity concentration than the lower layer thereof.

15. A semiconductor device according to claim 14, wherein said first and second conductivity type are n-type and p-type, respectively.

16. A semiconductor device according to claim 14, wherein a third depletion region which extends from the channel of each of said first CCDs is precluded from meeting, under each of the plurality of electrodes thereof, said first depletion region, during charge transfer in said first CCDs, by the presence of the upper layer of said two-layer vertically stacked structure.

17. A semiconductor device according to claim 16, wherein said first and second conductivity type are n-type and p-type, respectively.

18. In a semiconductor device including vertical charge coupled devices (CCDs) provided on a semiconductor substrate of a first conductivity type, each having a channel forming layer and a plurality of transfer electrodes insulatedly disposed thereover, for effecting a sequential transfer of signal charges stored in a plurality of photoelectric conversion elements, along a first direction; and a horizontal charge coupled device (CCD) provided on said semiconductor substrate for transferring signal charges, received from said vertical CCDs, along the channel thereof in a second direction, orthogonal to said first direction with respect to a plane in parallel to a principal surface of said semiconductor substrate, said horizontal CCD having a channel forming layer of the first conductivity type formed on a well region of a second conductivity type, which well region is provided on said semiconductor substrate, and a plurality of transfer electrodes insulatedly disposed thereover, a method for operating said horizontal CCD and vertical CCDs comprising at least the steps of:

with respect to said horizontal CCD, applying a predetermined voltage to the plurality of transfer electrodes thereof in a repeating sequence and providing a first depletion region in the channel region for charge transfer, and applying a second predetermined voltage between the semiconductor substrate and the well region so as to effect a second depletion layer at an interface between said well region and said semiconductor substrate, wherein said first and second depletion regions are configured so as to meet under each one of the plurality of electrodes at least over an underlying region covering a part of the channel layer periphery; and with respect to each of said vertical CCDs, applying a predetermined voltage to the plurality of transfer electrodes thereof in a repeating sequence and effecting a third depletion region in a channel region thereof for charge transfer, wherein said vertical CCDs are operated so that in each one thereof the corresponding third depletion region produced is configured so as not to meet, under each one of the plurality of transfer electrodes thereof, the depletion region effected at an interface between an underlying semiconductor region and said semiconductor substrate.

19. A method of operating according to claim 18, wherein in each one of said vertical CCDs said semiconductor region, which is of said second conductivity type, is comprised of a two-layer stacked structure of the same conductivity type and that the impurity concentration of the upper layer thereof is higher than the impurity concentration of the lower layer thereof.

20. A method of operating according to claim 19, wherein each of said vertical CCDs further include:

a plurality of electrodes insulatedly formed on a further semiconductor region of the first conductivity type, corresponding to a channel forming region, provided on the upper layer of said semiconductor region of said second conductivity type, wherein said lower layer is provided on said semiconductor substrate, and wherein the depletion region, extended from the channel thereof, produced during transfer of signal charges is prevented from meeting the depletion region produced at the interface between said lower layer and said semiconductor substrate by the presence of said upper layer.

21. A method of operating according to claim 18, wherein the semiconductor region with respect to each of said vertical CCDs corresponds to a different part of a semiconductor well region which also underlies the channel forming layer of said horizontal CCD.

22. A method of operating according to claim 20, wherein the semiconductor region with respect to each of said vertical CCDs corresponds to a different part of a semiconductor well region which also underlies the channel forming layer of said horizontal CCD.

* * * * *